United States Patent [19]
Chan et al.

[11] Patent Number: 6,097,651
[45] Date of Patent: Aug. 1, 2000

[54] PRECHARGE CIRCUITRY IN RAM CIRCUIT

[75] Inventors: Andrew K. Chan, Palo Alto; James M. Apland, Gilroy; Ket-Chong Yap, Fremont, all of Calif.

[73] Assignee: QuickLogic Corporation, Sunnyvale, Calif.

[21] Appl. No.: 09/345,971

[22] Filed: Jun. 30, 1999

[51] Int. Cl.[7] .................................................. G11C 7/00
[52] U.S. Cl. .................................... 365/203; 365/154
[58] Field of Search ................................. 365/203, 154, 365/156, 230.05

[56] References Cited

U.S. PATENT DOCUMENTS

| | | | |
|---|---|---|---|
| 4,845,676 | 7/1989 | Lohlein et al. | 365/154 |
| 5,239,502 | 8/1993 | Carlstedt | 365/154 |
| 5,353,251 | 10/1994 | Uratani et al. | 365/154 |
| 5,687,325 | 11/1997 | Chang | 395/284 |
| 6,011,711 | 1/2000 | Hodges et al. | 365/154 |

*Primary Examiner*—Tan T. Nguyen
*Attorney, Agent, or Firm*—Skjerven, Morrill, MacPherson, Franklin and Friel

[57] ABSTRACT

A random access memory (RAM) device includes a buffer in the memory cell to isolate the latching circuit from the read bit line. Consequently, read disturb errors caused by capacitive loading on the read bit line are avoided. Further, the precharge requirements on the write bit line are simplified because the buffer permits optimization of the latching circuit in the memory cell. The RAM device includes a precharge circuit that precharges the write bit line to a ground reference voltage prior to performing write operations. By precharging the write bit line to ground reference voltage, write disturb problems caused by capacitive loading on the write bit line are avoided. Further, by coupling the write bit line to ground reference voltage, little or no power is consumed by precharging the write bit line.

11 Claims, 14 Drawing Sheets

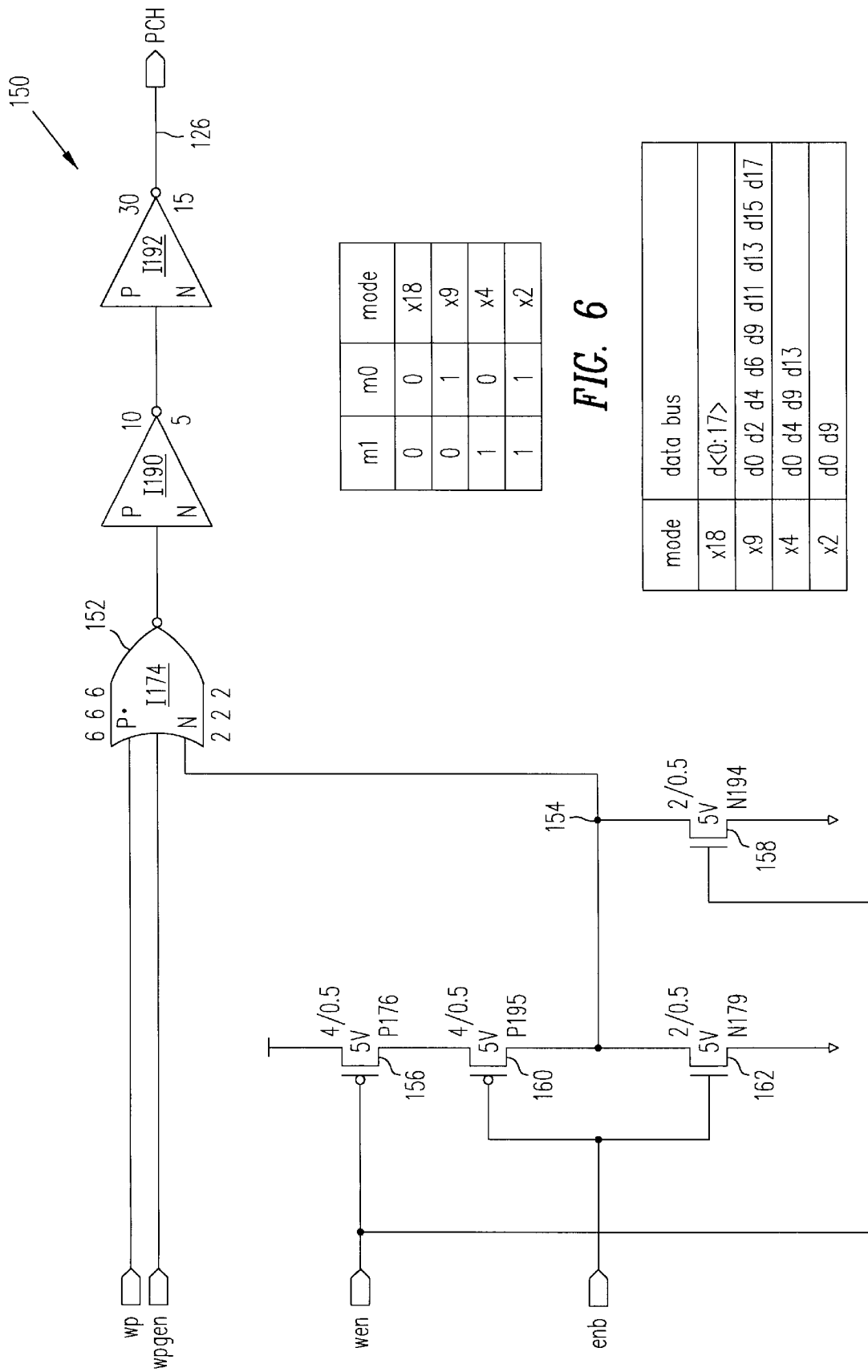

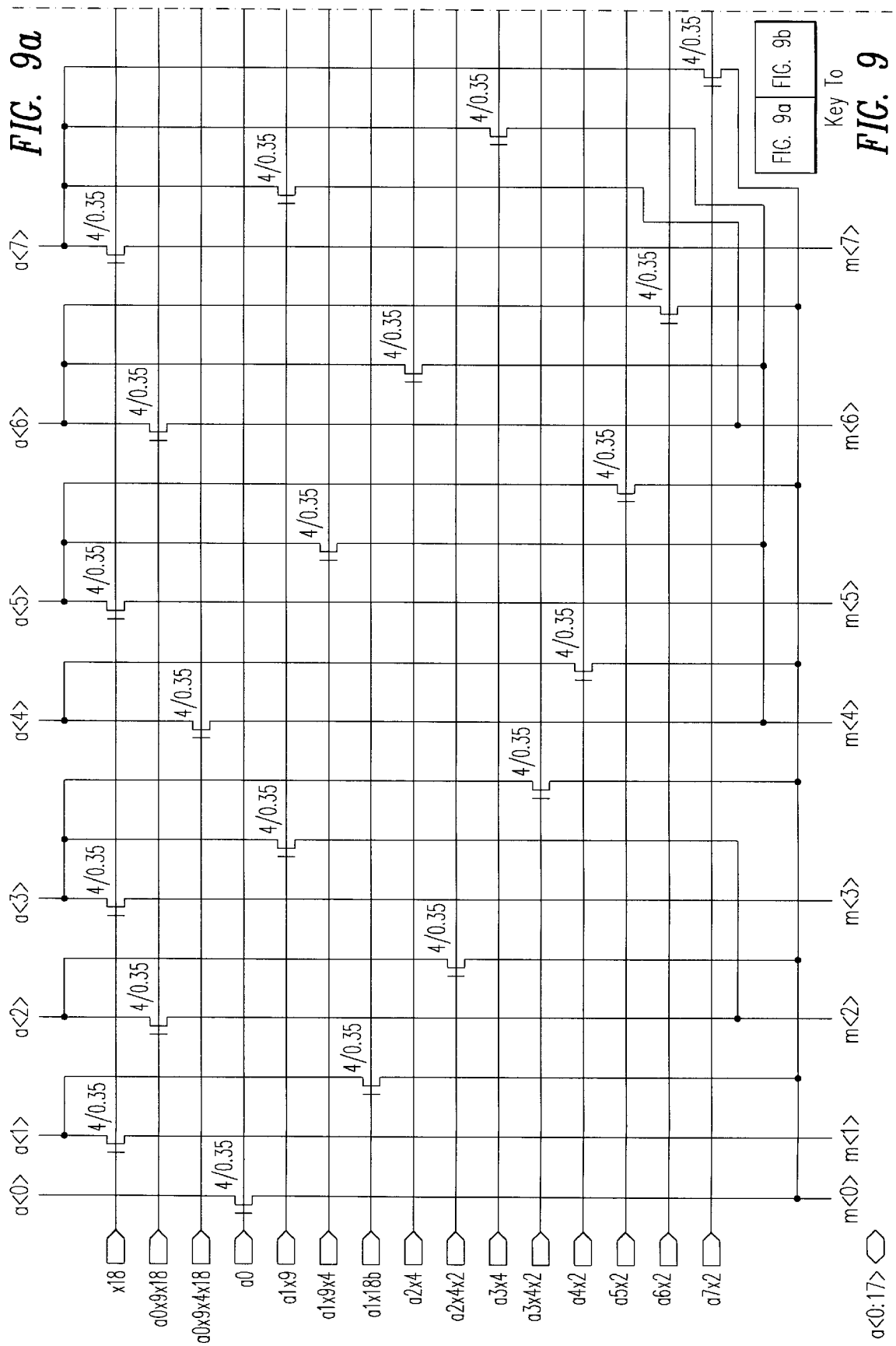

6,097,651

PRECHARGE CIRCUITRY IN RAM CIRCUIT

FIELD OF THE INVENTION

The present invention relates to semiconductor memory devices, and more particularly to precharging circuitry for random access memory (RAM) devices.

BACKGROUND

Integrated semiconductor memory devices must be capable of high speed operation. To improve the overall speed of memory devices, a bit line precharge circuit is conventionally used to produce a desired voltage level on bit lines prior to a write or read operation. By first producing a desired voltage level on bit lines, the speed of a memory device may be maximized during read or write operations.

FIG. 1 shows a conventional RAM circuit 10, including a conventional MOS static RAM cell 12 coupled between a bit line pair BL1 14 and BL2 16, and coupled to word line WL 18. RAM cell 12 includes a resistor 20 and an NMOS transistor 22 coupled in series to form the first inverter of the memory cell 12, and a second resistor 24 and a second NMOS transistor 26 coupled in series to form the remaining inverter. These two inverters are connected in a positive feedback fashion to create a latching circuit. Two transistors, NMOS transistor 28 and NMOS transistor 30, serve as transmission gates or pass transistors connecting the latching circuit to bit line pair BL1 14 and BL2 16, respectively. The gates of transistors 28 and 30 are connected to word line WL 18.

Typically, a RAM device 10 will have many memory cells 12 disposed in parallel between bit lines BL1 14 and BL2 16. The number of memory cells, however, contribute to a relatively large capacitive loading on bit lines BL1 14 and BL2 16. The capacitive loading on the bit lines create read and write disturb problems. Read and write disturb problems occur when the pass transistors 28 and 30 are activated to couple the latching circuit to the bit lines BL1 14 and BL2 16. If the capacitance on either bit line BL1 14 or BL2 16 is large enough, the data latched in the RAM cell 12 may be altered during reading of that RAM cell, i.e., a read disturb problem. Alternatively, random data can be unintentionally written into RAM cell 12 when another RAM cell (not shown) that is on word line 18 is in a write cycle, i.e., a write disturb problem. Thus, prior to activating transistor 28 and 30, precharge circuits are used to equalize and regulate the voltage on the bit lines BL1 14 and BL2 16 to prevent read or write disturb problems.

Thus, RAM circuit 10 includes conventional precharge circuits 40, 41 coupled to bit lines BL1 14 and BL2 16, respectively, and an NMOS transistor 47 coupled between bit lines BL1 14 and BL2 16. As shown, precharge circuits 40, 41 use two NMOS transistors 42, 44 and 43, 45, respectively, in a voltage divider configuration between a voltage source Vcc and ground. When precharge circuits 40, 41 and transistor 47 receive a precharge signal PCH, which is asserted on the gates of NMOS transistors 42, 44 and 43, 45, precharge circuits 40, 41 provide a precharge voltage level on bit lines BL1 14 and BL2 16. Precharge circuits 40, 41 precharge bit lines BL1 14 and BL2 16 to a voltage level that is some portion of Vcc, e.g., ½ Vcc. By applying the desired precharge voltage level on bit lines BL1 14 and BL2 16, the read reliability and switching time for a read operation are greatly improved.

Unfortunately, precharge circuits 40, 41 and a sense amplifier (not shown) that conventionally reads BL1 14 and BL2 16 draw substantial current during the precharge operation, which creates a current spike. Typically, RAM device 10 includes many pairs of bit lines, each of which is precharged. Consequently, the total amount of power consumed using conventional precharge circuit is large.

SUMMARY

A dual port random access memory (RAM) device includes a buffer in the memory cell to isolate the latching circuit from the read bit line. The buffer prevents any capacitive loading on the read bit line from creating any read disturb problems. Thus, the read bit line requires no precharging. The buffer also permits the latching circuit in the memory cell to be optimized for write speed. The RAM device also includes a precharge circuit that precharges the write bit line to a ground reference voltage prior to the RAM performing write operations. The latching circuit is optimized to maintain data integrity when the write bit line is floating at ground level during active operation, thus write disturb problems are avoided. Because the precharge circuit couples the write bit line to ground by a single NMOS transistor, very little or no power is consumed in precharging the write bit line.

BRIEF DESCRIPTION OF THE DRAWINGS

FIG. 3 shows an embodiment of a precharge control circuit that may be used to control the precharge circuit shown in FIG. 2.

FIG. 6 is a truth table showing the mode designated by the mode decoder based on the input signals on the two mode input ports.

FIG. 10 is a table indicating the data busses used in input output multiplexor in the different modes.

DETAILED DESCRIPTION

Figure 1:
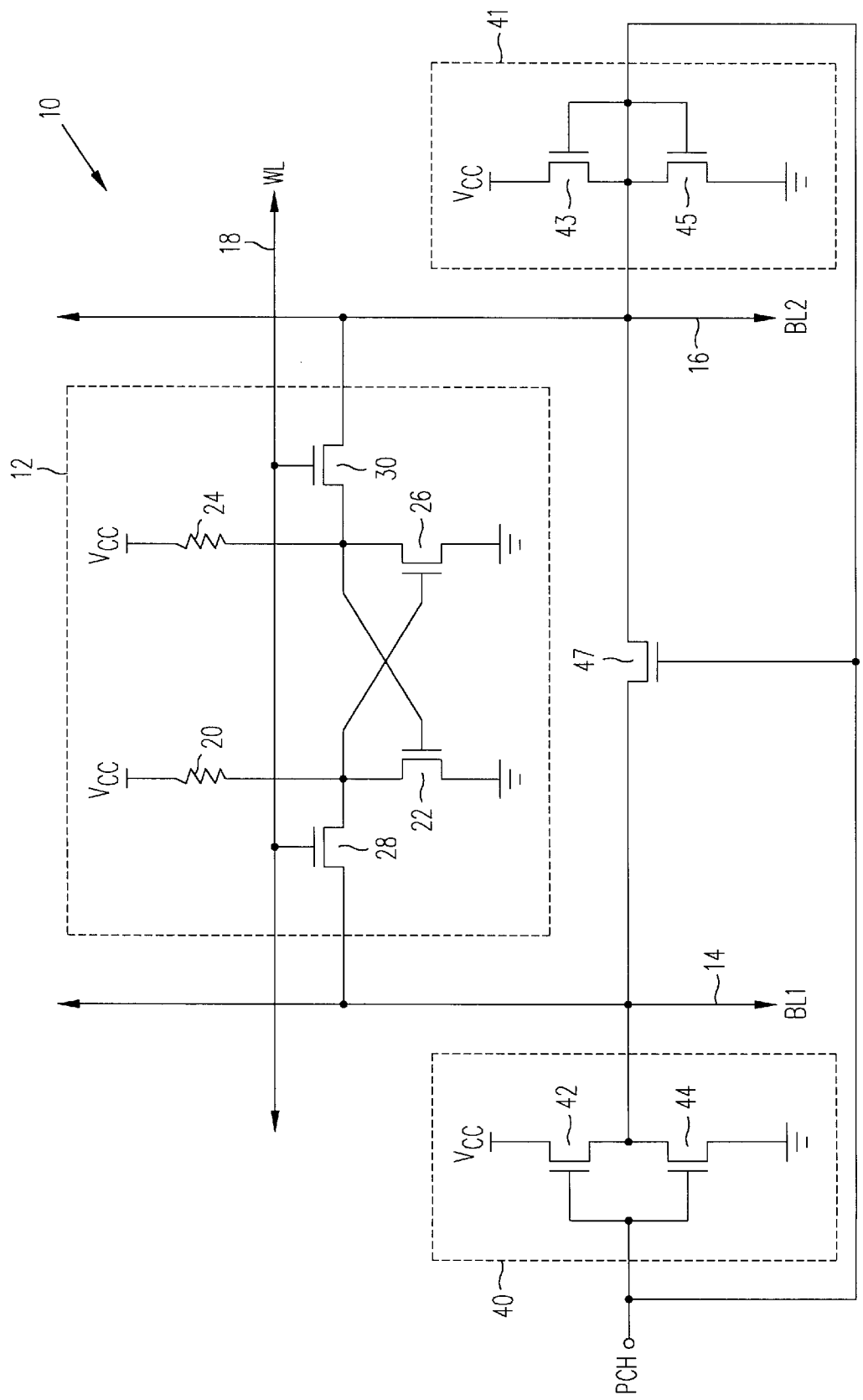
FIG. 1 is a circuit diagram of a conventional RAM circuit, including a MOS static RAM cell disposed between a pair of bit lines coupled to precharge circuits.
Figure 2:
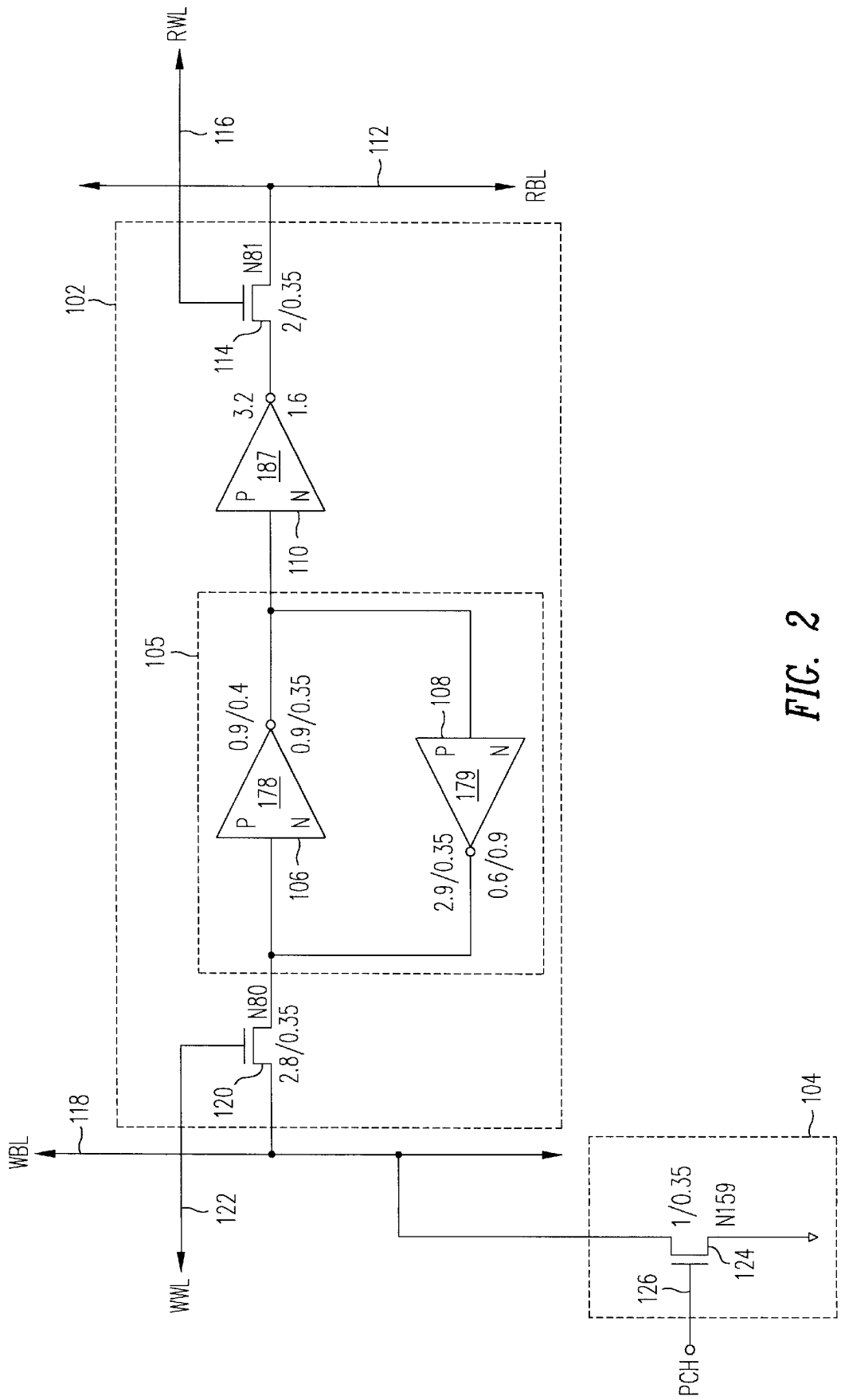
FIG. 2 is a circuit diagram of a portion of a dual port static random access memory (SRAM) device, including a memory cell and precharge circuit in accordance with an embodiment of the present invention.
Figure 4A:
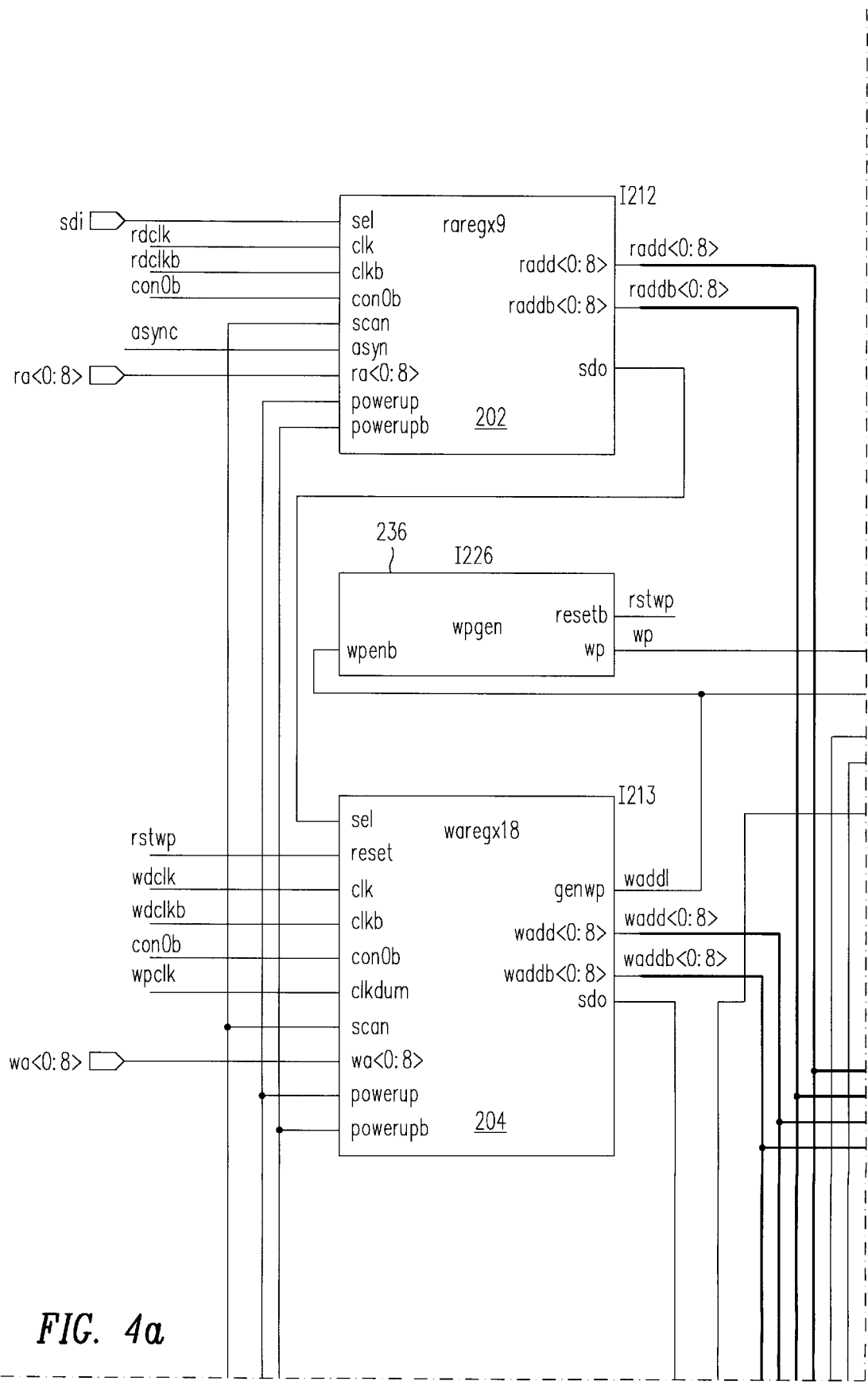
FIG. 4 shows a schematic view of a configurable RAM block that has a configurable depth and width and includes a memory cell and precharge circuit in accordance with an embodiment of the present invention.
Figure 4B:
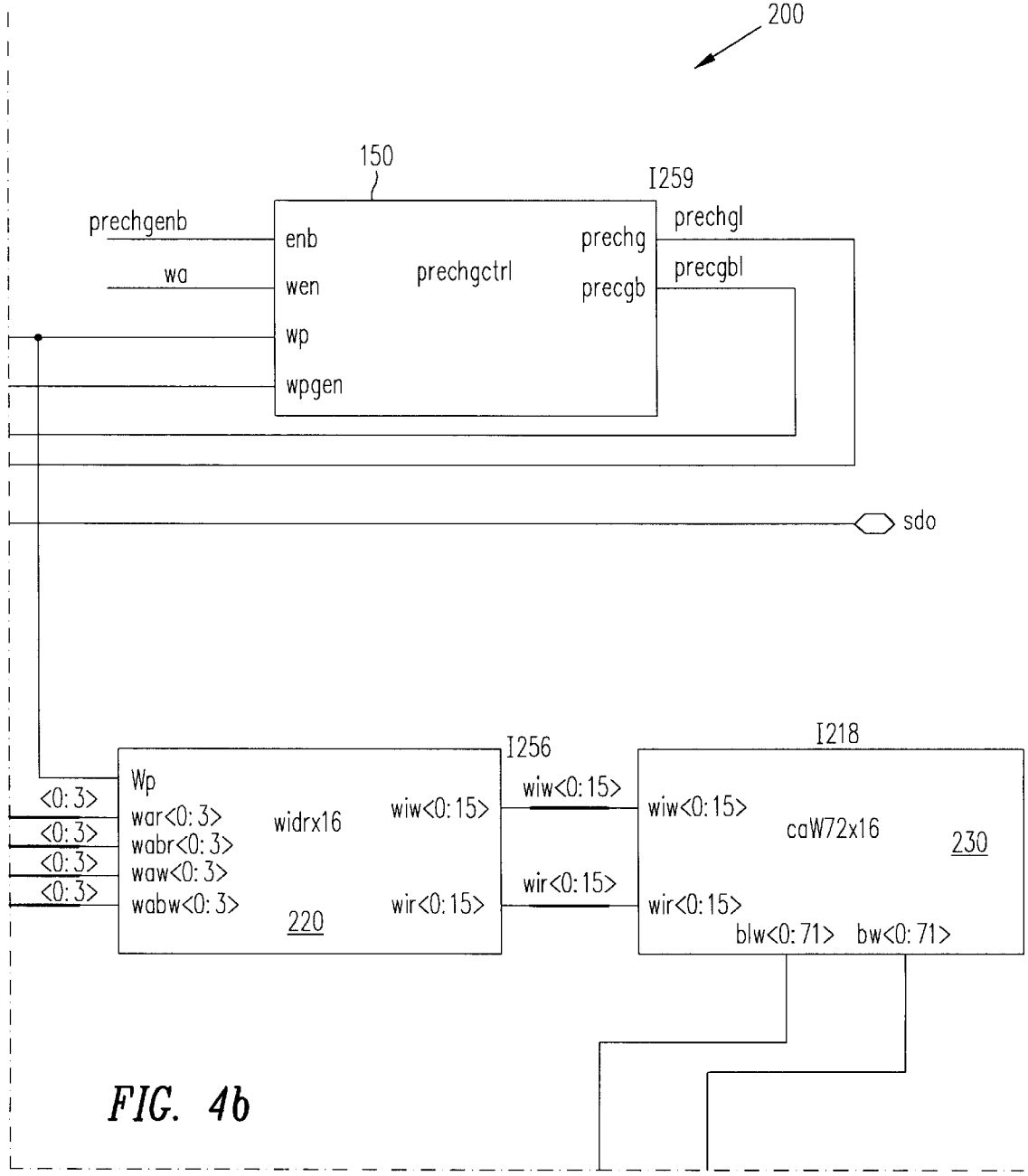
Figure 4C:
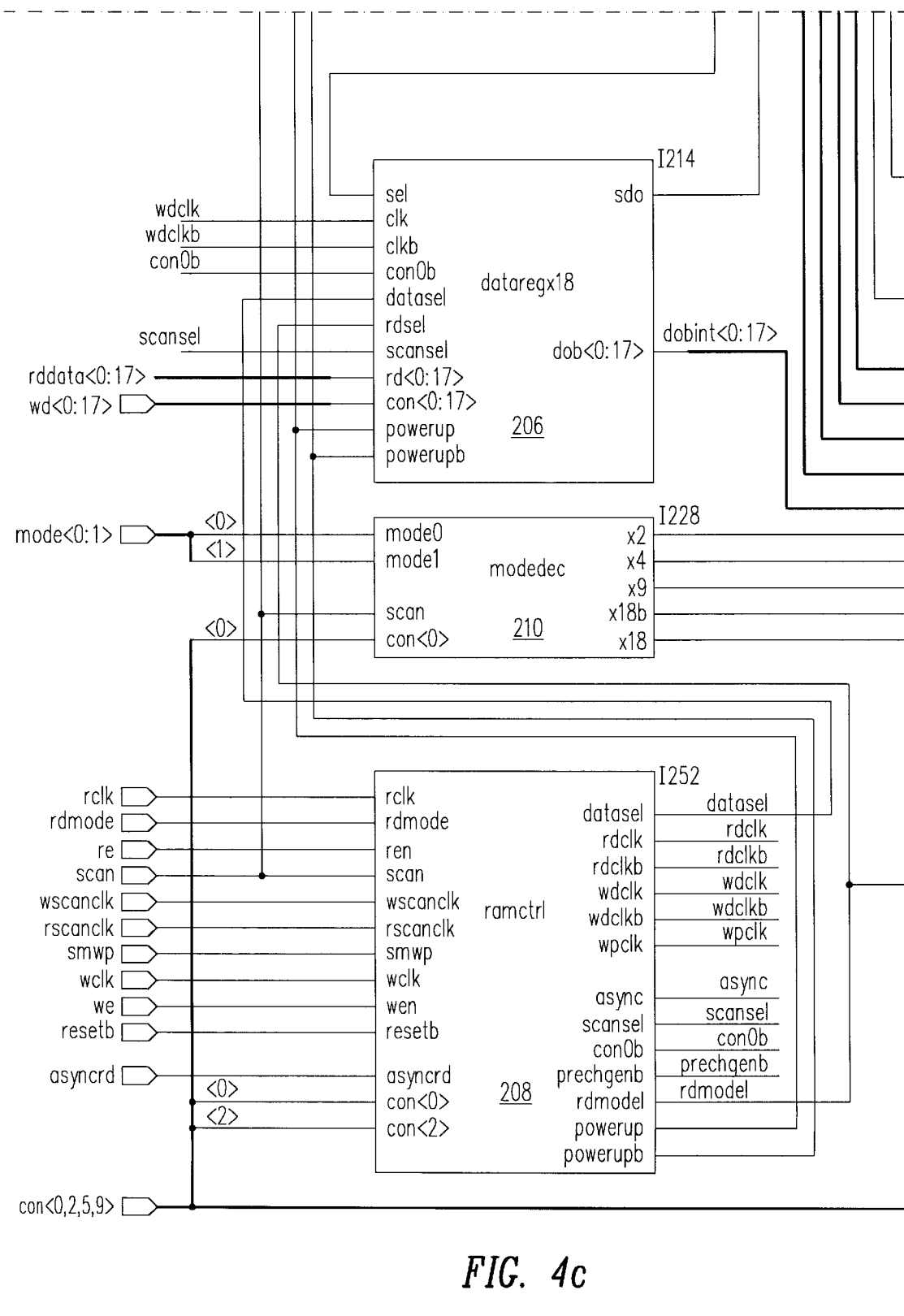
Figure 4D:
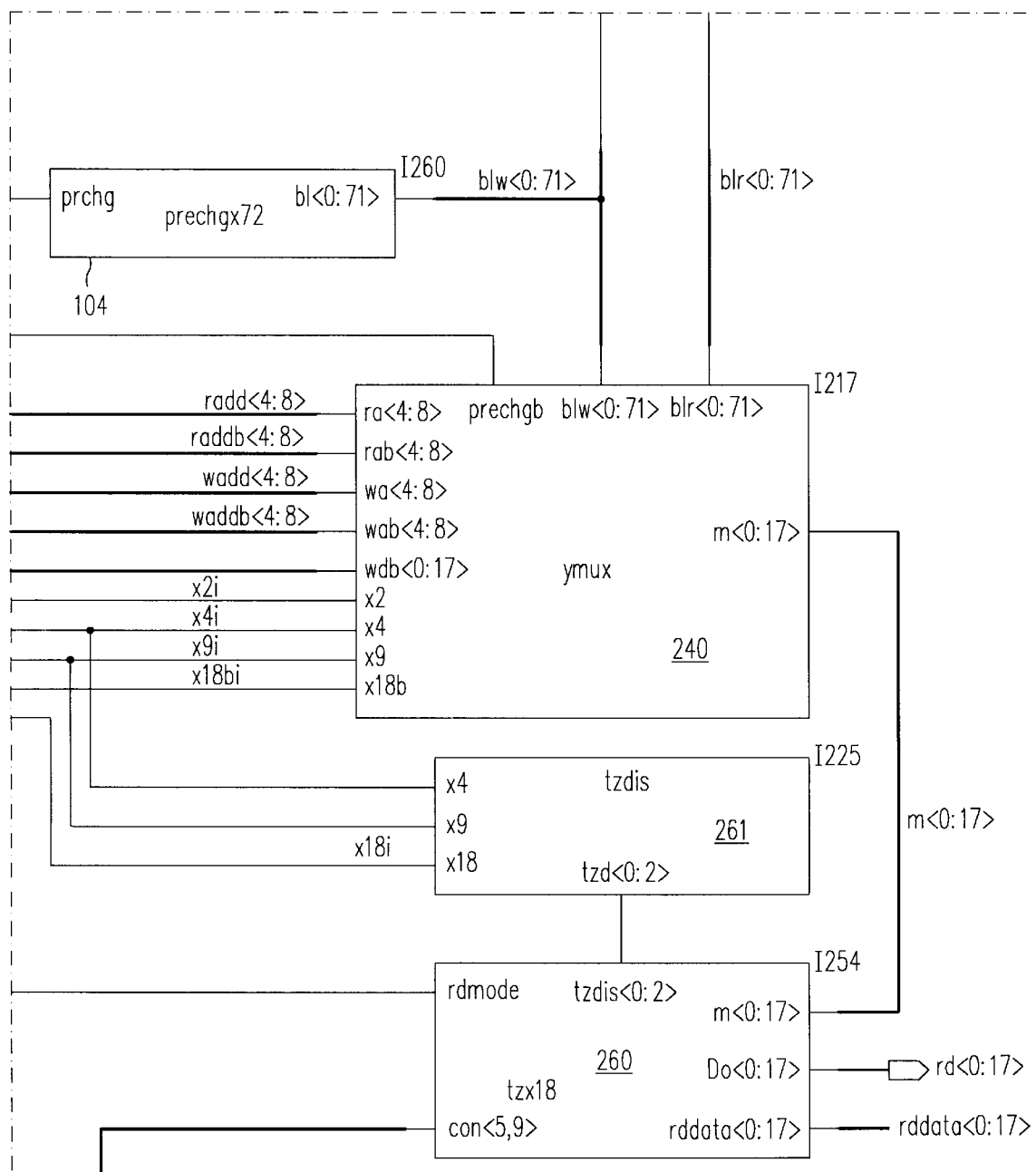

FIG. 2 is a circuit diagram of a portion of a dual port random access memory (RAM) device 100, including a single memory cell 102 and precharge circuit 104, in accordance with an embodiment of the present invention.

Memory cell 102 is disposed between a read bit line RBL1 12 and a write bit line WBL1 18. The memory cell 102 includes a latching circuit 105 having a first inverter 106 cross-connected with a second inverter 108. The output terminal of the first inverter 106 is coupled to the input terminal of the second inverter 108, while the output terminal of the second inverter 108 is coupled to the input terminal of the first inverter 106. The second inverter 108 is generally weaker and has greater resistance than the first inverter 106. Thus, by overcoming the weak output of the second inverter 108, a signal at the input terminal of the first inverter 106 will change the output state of the first inverter 106. The second inverter 108 then provides feedback to latch the state of the first inverter 106.

The memory cell 102 also includes a buffer 110 that is used to isolate the latching circuit 105 from the read bit line RBL 112. Thus, latching circuit 105 does not charge or discharge the capacitance on the read bit line RBL 112, thereby avoiding read disturb problems. As shown in FIG. 2, the output terminal of the first inverter 106 is coupled to the input terminal of buffer 110. Buffer 110 is larger than either first inverter 106 or second inverter 108.

The read bit line RBL 112 is connected to buffer 110 through an NMOS transistor 114 in memory cell 102. The gate of transistor 114 is connected to a read word line RWL 116, which is connected to a conventional read word line decoder circuit (not shown). When a read signal is asserted on read word line RWL 116, the read signal activates transistor 114 to connect the read bit line RBL 112 to the output terminal of the buffer 110. The latching circuit 105 produces an inverted signal indicative of the stored contents. However, because buffer 110 is an inverter, read bit line RBL 112 receives a non-inverted output signal indicative of the contents of memory cell 102.

While only one memory cell 102 is shown in FIG. 2, it should be understood that generally many memory cells 102 will be disposed between read bit line RBL 112 and write bit line WBL 118. Because there are multiple memory cells coupled between bit lines 112 and 118, however, there may be a large capacitive loading on bit lines 112 and 118. In a conventional memory cell, a large capacitive loading on the bit lines would create a write and read disturb problem. However, buffer 110 advantageously prevents read disturb problems by isolating the latching circuit 105, i.e., inverters 106 and 108, from the capacitance on read bit line RBL 112. Read bit line RBL 112 is not precharged because buffer 110 isolates the latching circuit 105 from any large capacitive loading that may cause read disturb problems.

The write bit line WBL 118 is connected to latching circuit 105 through another NMOS transistor 120. The gate of transistor 120 is connected to a write word line WWL 122, which is connected to a conventional write word line directory circuit (not shown). When a write signal is asserted on write word line WWL 122, the write signal activates transistor 120 to connect the write bit line WBL 118 to the input terminal of the first inverter 106. The voltage level on the write bit line WBL 118 overcomes the output signal from the second inverter 108. The first inverter 106 receives the voltage level on the write bit line WBL 118 and produces an inverted signal at the output terminal. The cross connected second inverter 108 provides feedback to the first inverter 106. Thus, the signal level on the write bit line WBL 118 is stored in memory cell 102.

As shown in FIG. 2, precharge circuit 104 is used to couple write bit line WBL 118 to a ground reference voltage. Precharge circuit 104 includes an NMOS transistor 124 coupled between write bit line WBL 118 and a ground reference voltage. The gate of transistor 124 receives a precharge signal PCH on signal line 126 from a precharge control circuit, an example of which is shown in FIG. 3. When a precharge signal PCH is asserted on the gate of transistor 124, transistor 124 is activated to connect the write bit line WBL 118 to the ground reference voltage. The precharge signal PCH is asserted on transistor 124 long enough to precharge the write bit line WBL 118. The precharge signal PCH is asserted whenever RAM device 100 is not in a write cycle, i.e., producing a write pulse, thus the length of the precharge signal PCH pulse is dependent on the write period. Thus, for example, if the write period is 6 ns (nanoseconds) and the write pulse is 2.8 ns, the precharge signal PCH pulse width is 3.2 ns. Once the write bit line WBL 118 is precharged and prior to the RAM device 100 performing a write operation, transistor 124 is turned off, which leaves the write bit line WBL 118 floating at ground level.

With the write bit line WBL 118 floating at ground level, a write disturb problem may occur only if latch 105 is storing a high value, i.e., the input terminal of first inverter 106 is high. When latch 105 is storing a high value and write bit line WBL 118 is floating at ground level, if a write signal is asserted on write word line WWL 122 to activate a write operation in another memory cell (not shown), the input terminal of first inverter 106 will be coupled to floating ground level.

To prevent write disturb problems, latch 105 is designed to overcome a floating ground level on write bit line WBL 118 to maintain data integrity. Thus, second inverter 108 must produce a high output signal that is large enough to overcome the floating ground level when latch 105 is coupled to write bit line 118. However, care must be taken to ensure that if latch 105 is coupled to ground level, as opposed to floating ground level, the high output signal of second inverter 108 will be overcome and the latch will switch to a low level.

It should be understood, however, that because there is a capacitance on write bit line WBL 118 that is related to the number of rows of memory cells coupled to write bit line WBL 118. If there are too many memory cells coupled to write bit line WBL 118, the high output signal from the second inverter 108 will not be strong enough to overcome the floating ground level. Thus, there is an upper limit to the number of rows of memory cells 102 that may be coupled to write bit line WBL 118. It has been determined that precharge circuit 104 may safely precharge a write bit line WBL 118 that is coupled to thirty-two rows of memory cells 102, which has approximately 0.2–0.3 pf (picofarads).

Table 1 below sets forth appropriate designs of the devices in memory cell 102 and precharge circuit 104 using 0.35 µm design rules.

TABLE 1

| Device | | Width (µm) | Length (µm) |
| --- | --- | --- | --- |
| Inverter 106 | PMOS Transistor | 0.9 | 0.4 |
| | NMOS Transistor | 0.9 | 0.35 |
| Inverter 103 | PMOS Transistor | 2.9 | 0.35 |
| | NMOS Transistor | 0.6 | 0.9 |
| Buffer 110 | PMOS Transistor | 3.2 | 0.35 |
| | NMOS Transistor | 1.6 | 0.35 |
| Transistor 114 | | 2.0 | 0.35 |
| Transistor 120 | | 2.8 | 0.35 |
| Transistor 124 | | 1.0 | 0.35 |

The size of buffer 110, as well as transistor 114, are optimized for read speed. Because buffer 110 is used to isolate the latching circuit 105 from the read bit line RBL 112, latching circuit 105 can be optimized for write speed and write integrity, as shown in Table 1. With the latching circuit 105 optimized, there is no need to precharge write bit line WBL 118 to a portion of Vcc, e.g., ½ Vcc. By precharging write bit line WBL 118 to ground reference voltage, very little or no power is consumed during the precharge operation. Thus, precharge circuit 104 is more efficient in power consumption than conventional precharge circuits 40, 41.

FIG. 3 shows one embodiment of a precharge control circuit 150 that may be used to control precharge circuit 104. Precharge control circuit 150 includes a three input terminal NOR logic gate 152. The output terminal of NOR logic gate 152 is connected through inverters to signal line 126 and produces the precharge signal PCH, which is received by transistor 124 in precharge circuit 104 (FIG. 2.).

The first and second input terminals of NOR logic gate 152 receive a write pulse signal wp and a write pulse generate signal wpgen. The write pulse generate signal wpgen is received from a conventional write address register (not shown). A delay circuit (not shown) also receives the write pulse generate signal wpgen and produces the write pulse signal wp. The write pulse signal wp is delayed from the write pulse generate signal wpgen so that the write address can be stabilized before the write pulse wp is actually produced.

The third input terminal of NOR logic gate 152 is connected to a node 154. Node 154 receives a logic NOR signal based on a write enable signal wen and a precharge enable signal enb. The write enable signal wen is received by the gate of a PMOS transistor 156 and an NMOS transistor 158. Transistor 158 is coupled between node 154 and ground reference voltage. Transistor 156 is coupled to a voltage source Vcc and to the ground reference voltage through a PMOS transistor 160 and an NMOS transistor 162 connected in series. The gates of transistors 160 and 162 receive the precharge enable signal enb. Transistor 162 is coupled between node 154 and the ground reference voltage. Thus, if either the write enable signal wen or the precharge enable signal enb are a logic "1", node 154 will be coupled to the ground reference voltage, i.e., logic "0", through either transistor 158 or transistor 162, respectively.

The write enable signal wen is conventionally generated when it is desired that RAM device 100 perform a write operation. The precharge enable signal enb is a test signal and is a logic "0" during normal operation of RAM device 100.

It should be understood, of course, that precharge control circuit 150 is one example of a control circuit that may be used to control the timing of precharge circuit 104. Those of ordinary skill in the art will understand that precharge circuit 104 can be controlled to appropriately precharge the write bit line WBL 118 using any desired precharge control circuit.

FIGS. 4 through 10 show detailed schematics, in various detail, and associated tables of a RAM device 200 that uses memory cell 102, precharge circuit 104 and precharge control circuit 104. RAM device 200 is a dual port device that has a configurable depth and width. Conventional areas of RAM device 200 are shown in FIGS. 4 through 10 in block form in order to avoid unnecessarily obfuscating the present invention.

As shown in FIG. 4, RAM device 200 is a dual port RAM having a conventional read address register 202 and a separate conventional write address register 204. Read address register 202 includes nine ports to receive the read address (ra<0:8>) and the write address register includes nine ports to receive the write address (wa<0:8>). Because there are physically nine ports to receive the read address (ra<0:8>) and the write address (wa<0:8>), the RAM device 200 can support a deep configuration, i.e., the 512×2 configuration. RAM device 200 can also support shallower configurations, such as 256×4, 128×9, and 64×18. In the shallower configuration some of the address ports in read address register 202 and write address register 204 will not be used. As shown in FIG. 4, read address register 202 and write address register 204 receive independent control signals including their own clocking signals (rdclk and wdclk, respectively) from a RAM control 208. This advantageously permits RAM device 200 to read and write data simultaneously and at different clock frequencies.

RAM device 200 also includes a conventional data register 206, which receives write data (wd<0:17>), which is the input data to the RAM device 200. There are physically eighteen ports into data register 206 for receiving write data (wd<0:17>) so that a wide configuration, i.e., ×18, is supported by RAM device 200. In narrow configurations, e.g., ×2, ×4, and ×9, some of the ports will not be used.

Also included in RAM device 200 is the RAM control 208. RAM control 208 controls the operation of RAM device 200. As can be seen in FIG. 4, RAM control 208 receives a number of input signals, including separate read clock signals (rclk) and write clock signals (wclk), as well as other input signals, which RAM control 208 uses to independently control read address register 202 and write address register 204. RAM control 208 is a conventional RAM control circuit except that it independently controls read operation on one port and a write operation on the other port.

Figure 5:
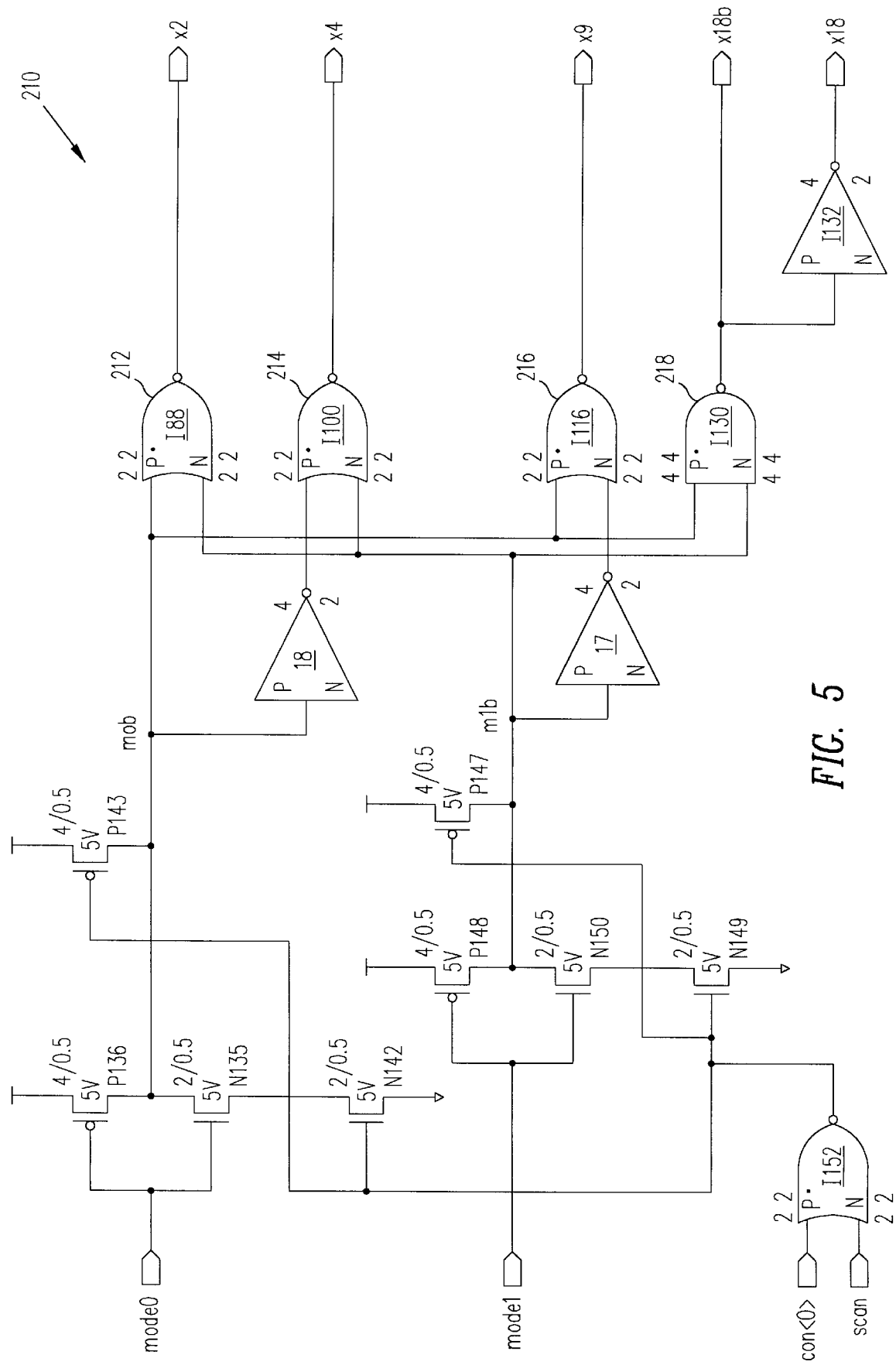
FIG. 5 shows a detailed schematic view of the mode decoder shown in FIG. 4.

RAM device 200 also includes a mode decoder 210, which decodes the mode control signals (mode<0:1>) used to define the depth and width configuration of RAM device 200. Mode decoder 210 is shown in greater detail in FIG. 5. As shown in FIG. 5, mode decoder 210 receives two mode input ports (mode0 and mode1), which are logically converted by NOR logic gates 212, 214, and 216 and NAND logic gate 218 into configuration signals used to configure the depth and width of RAM device 200, i.e., ×2, ×4, ×9, or ×18. In addition, mode decoder 210 receives a control signal (con<0>) and a scan signal (scan). Control signal (con<0>) is an internal disable signal that is used to facilitate testing of the RAM during production. Scan signal (scan) is used in power up loading of the RAM. Both control signal (con<0>) and scan signal scan are logic "0" during normal operation of the RAM device 200 and are not relevant to the operation of the present invention. FIG. 6 is a truth table showing the mode designated by mode decoder 210 based on the input signals on the two mode input ports (mode0 and mode1), which are fixed during programming.

The read address register 202 and write address register 204 produce read address signals (radd<0:8>) and write address signals (wadd<0:8>), respectively. The first four least significant bits of read address (radd<0:3>) and write address (wadd<0:3>) are received by a conventional ×16 word line decoder 220, which provides write word line signals (wlw<0:15>) and read word line signals (wlr<0:15>) to an array 230 of memory cells. A plurality of memory cells 102, shown in FIG. 2, are used in the array 230 of memory cells.

The remaining bits of the read address signal (radd<4:8>) and write address signal (wadd<4:8>) are received by multiplexor 240. Multiplexor 240 also receives the output signals from mode decoder 210 designating the size configuration of RAM device 200 and the write data (wdb<0:17>) from the data register 206 to be written into the array of memory cells 230 during write operations. Multiplexor 240 produces the signals on the write bit line (blw<0:71>) to the array of memory cells 230, and receives the signals on read bit line (blr<0:71>) from cell 230. Multiplexor 240 also produces the read data (m<0:17>) from cell 230 during read operations.

Precharge circuit 104 (FIG. 2) is coupled to the write bit line (blw<0:71>). Precharge circuit 104 is controlled by precharge control circuit 150 (FIG. 3). Precharge control circuit 150 receives the write pulse signal from the write pulse generator 236, which produces a delayed write pulse signal wp after receiving the generate write pulse signal GENWP from write address register 204.

Figure 7A:
FIG. 7 shows a detailed schematic view of the multiplexor shown in FIG. 4.
Figure 7B:
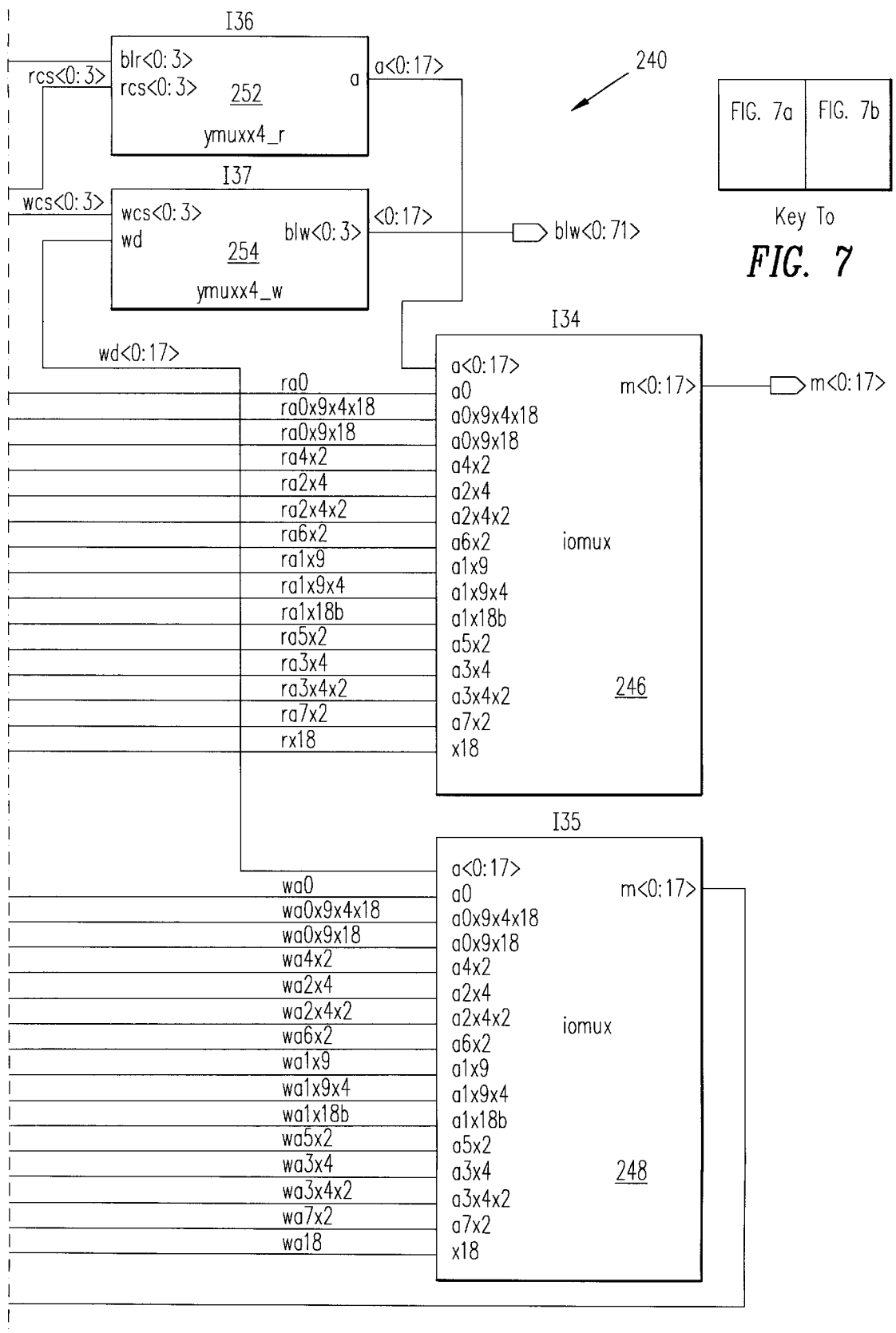
Figure 8A:
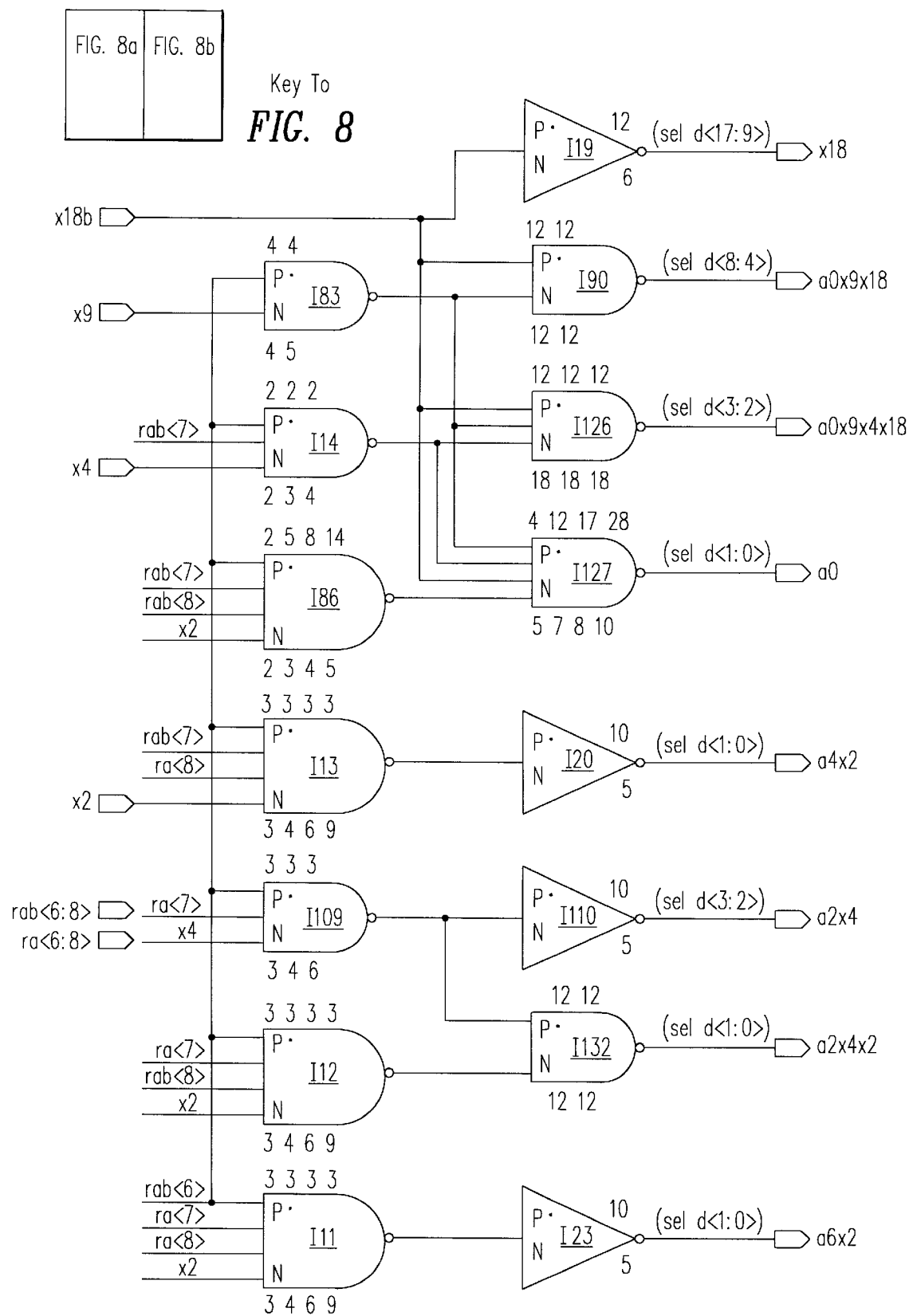
FIG. 8 shows a detailed schematic view of a decoder in the multiplexor shown in FIG. 7.
Figure 8B:
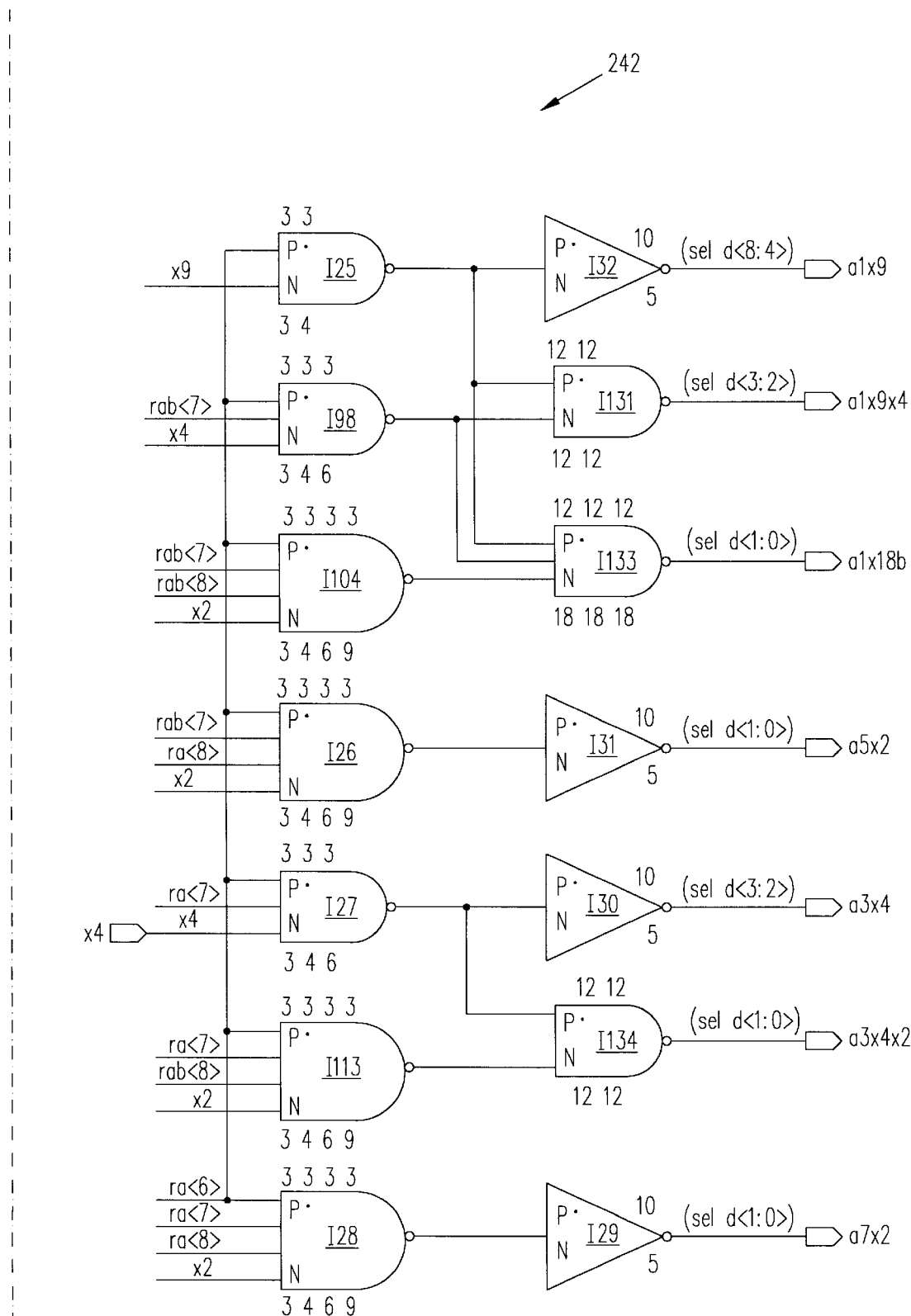

FIG. 7 shows a detailed schematic of multiplexor 240. As shown in FIG. 7, multiplexor 240 includes two decoders 242, 244 which receive some of the bits from the read address (ra<6:8>) and the write address (wa<6:8>), respectively, as well as the size configuration. FIG. 8 shows a detailed schematic of decoder 242. It should be understood that decoder 244 is substantially the same as decoder 242. Decoder 242 logically converts the mode and the address signals it receives into output signals.

Multiplexer 240 also includes a conventional predecode unit 250 and conventional read and write multiplexors 252, 254, which respectively receive the bit line read signals (blr<0:71>) from the cell 230 and transmit the bit line write signals (blw<0:17>) to the cell 230. Predecode unit 250 also receives an inverted precharge signal prechgb from the precharge control circuit 150.

Figure 9B:
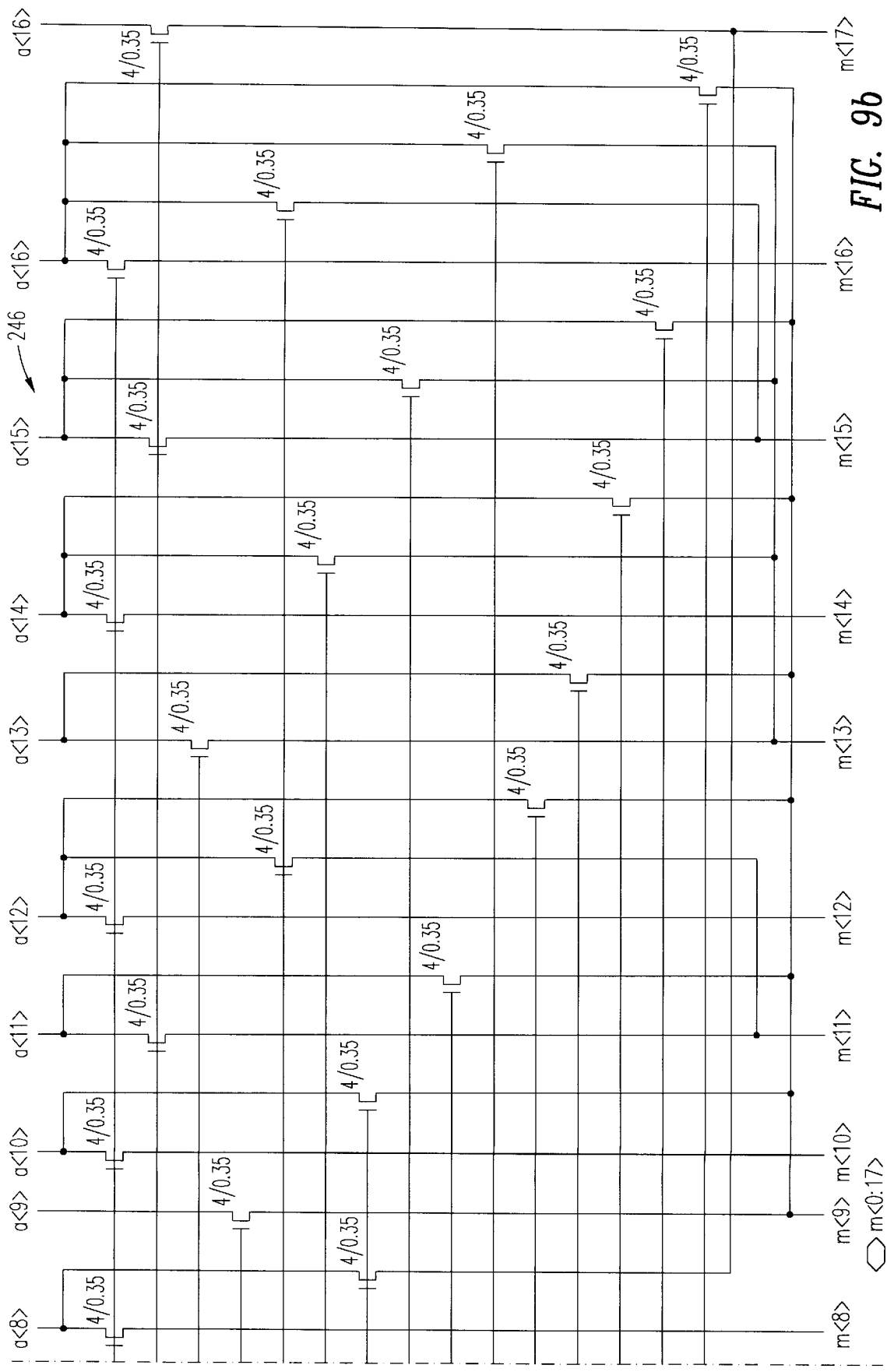
FIG. 9 shows a detailed schematic view of the input output multiplexor from the multiplexor shown in FIG. 7.

As shown in FIG. 7, multiplexor 240 includes two input/output multiplexors ("iomux") 246, 248, which receive the output signals from respective decoders 242, 244. As can be seen, iomux 248 receives the write data (wdb<0:17>) to be written into RAM device 200 from data register 206, while iomux 246 produces the read data (m<0:17>) to be produced by RAM device 200. FIG. 9 shows a detailed schematic of iomux 246. It should be understood, however, that iomux 248 is substantially similar to iomux 246. Based on the output signals generated by decoder 242, iomux 246 will select the appropriate data busses. FIG. 10 shows a table indicating the data busses that are used in the different modes. As shown in FIG. 10, in the ×18 mode all eighteen data busses are used, in the ×9 mode data busses d0, d2, d4, d6, d9, d11, d13, d15, and d17 are used, in the ×4 mode data busses d0, d4, d9, d13 are used, and in the ×2 mode only data busses d0 and d9 are used. Thus, iomux 246 can support a ×18 wide data register but, if desired, can convert to a narrower data register, such as a ×2, ×4 or ×9.

The read data (m<0:17>) produced by multiplexor 240 is received by a conventional driver buffer circuit 260, which produces the read data (rd<0:17>). Driver buffer circuit 260 is coupled to a conventional enable circuit 261 that receives the mode signals from mode decoder 210 and enables only output ports that are used. Thus, the unused output ports from driver buffer circuit are disabled.

While the present invention has been described in connection with specific embodiments, one of ordinary skill in the art will recognize that various substitutions, modifications and combinations of the embodiments may be made after having reviewed the present disclosure. The specific embodiments described above are illustrative only. Various adaptations and modifications may be made without departing from the scope of the invention. For example, the use of buffer 110 in a memory cell and precharge circuit 104 may be used in conventional non-configurable RAM devices.

Further, it should be understood that the precharge control circuit 150 is one example of a control circuit for precharge circuit 104. The spirit and scope of the appended claims should not be limited to the foregoing description.

What is claimed is:

1. A RAM memory device comprising:

a memory cell having a latching circuit disposed between a first bit line and a second bit line, said memory cell having a buffer disposed between said latching device and said second bit line; and a precharge circuit coupled to said first bit line, said precharge circuit precharging said first bit line to a ground reference voltage.

2. The RAM device of claim 1, said precharge circuit comprising a transistor that switchably couples said first bit line to a ground reference voltage.

3. The RAM device of claim 2, wherein said transistor switchably couples said first bit line to a ground reference voltage when a precharge signal is asserted on the gate of said transistor, said precharge signal being generated by a precharge control circuit in response to a write enable signal.

4. The RAM device of claim 1, said memory cell having a first transistor disposed between said latching circuit and said first bit line and a second transistor disposed between said buffer and said second bit line.

5. The RAM memory device of claim 1, said memory cell comprising:

a first transistor having a first terminal, a second terminal, and a third terminal, said first terminal coupled to said first bit line, said third terminal coupled to a first word line;

a first inverter having an input terminal and an output terminal, said input terminal coupled to said second terminal of said first transistor;

a second inverter having an input terminal and an output terminal, said second inverter input terminal being coupled to said first inverter output terminal, said second inverter output terminal coupled to said first inverter input terminal;

said buffer having an input terminal and an output terminal, said buffer input terminal being coupled to said first inverter output terminal; and a second transistor having a first terminal, a second terminal, and a third terminal, said first terminal of said second transistor coupled to said buffer output terminal, said second terminal of said second transistor coupled to said second bit line, and said third terminal of said second transistor coupled to a second word line.

6. The RAM memory device of claim 1, wherein said second bit line is not precharged.

7. A RAM memory device comprising:

a memory cell disposed between a write bit line and a read bit line, said memory cell comprising a latching circuit and an isolating means disposed between said read bit line and said latching circuit; and a means coupled to said write bit line for precharging said write bit line to ground reference voltage.

8. The RAM memory device of claim 7, wherein said means for precharging precharges said write bit line to a ground reference voltage prior to said RAM memory device performing a write operation.

9. The RAM memory device of claim 7, wherein said isolating means isolates said latching circuit from capacitive loading on said read bit line.

10. A method of operating a RAM memory device having a memory cell disposed between a write bit line and a read bit line, said method comprising:

provided a precharge on a write bit line;

providing a write signal on a write word line received by said memory cell;

providing a read signal on a read word line received by said memory cell to couple said memory cell to said read bit line; and isolating a latching circuit in said memory cell from said read bit line, such that when said memory cell is coupled to said read bit line said latching device does not charge or discharge the capacitance on said read bit line.

11. The method of claim 10, wherein providing a precharge on a write bit line comprises:

asserting a precharge signal; and coupling said write bit line to a ground reference voltage in response to asserting a precharge signal.

* * * * *